United States Patent
Lin et al.

(10) Patent No.: US 8,030,189 B2
(45) Date of Patent: Oct. 4, 2011

(54) METHOD FOR MAINTAINING A SMOOTH SURFACE OF CRYSTALLIZABLE MATERIAL

(75) Inventors: Ching-Fuh Lin, Taipei (TW); Cha-Hsin Chao, Taipei (TW); Wen-Han Lin, Taipei (TW)

(73) Assignee: National Taiwan University, Taipei (TW)

(*) Notice: Subject to any disclaimer, the term of this patent is extended or adjusted under 35 U.S.C. 154(b) by 22 days.

(21) Appl. No.: 12/607,963

(22) Filed: Oct. 28, 2009

(65) Prior Publication Data

US 2011/0065236 A1 Mar. 17, 2011

(30) Foreign Application Priority Data

Sep. 17, 2009 (TW) .............................. 98131398 A

(51) Int. Cl.
*H01L 20/20* (2006.01)
(52) U.S. Cl. .......... 438/486; 438/96; 438/308; 438/482; 257/E21.497
(58) Field of Classification Search .................... 438/71, 438/378; 257/E21.297, E21.497
See application file for complete search history.

(56) References Cited

U.S. PATENT DOCUMENTS

| | | | |
|---|---|---|---|
| 6,287,947 B1 | 9/2001 | Ludowise et al. | |
| 2002/0102820 A1* | 8/2002 | Hamada et al. | 438/486 |
| 2003/0185989 A1* | 10/2003 | Kamins | 427/376.1 |
| 2004/0020892 A1* | 2/2004 | Matthews et al. | 216/2 |
| 2005/0136612 A1* | 6/2005 | Lin et al. | 438/424 |
| 2009/0011341 A1* | 1/2009 | Hayashi et al. | 430/5 |
| 2009/0243043 A1 | 10/2009 | Wang | |
| 2010/0059751 A1* | 3/2010 | Takahashi et al. | 257/57 |

* cited by examiner

*Primary Examiner* — Walter L Lindsay, Jr.
*Assistant Examiner* — Cheung Lee
(74) *Attorney, Agent, or Firm* — Stout, Uxa, Buyan & Mullins, LLP

(57) ABSTRACT

A method for maintaining a smooth surface of crystallizable material is disclosed. First, a substrate is provided. A target material layer is then formed on the substrate, with the target material being a crystallizable material. A protecting layer is subsequently formed on the target material layer. Next, an annealing treatment is implemented, with the surface of the target material layer, facing the protecting layer, being maintained in its original smooth state by the pressure and/or adhesion of the protecting layer. Finally, the protecting layer is removed to leave an open and smooth surface of the processed crystallizable material.

19 Claims, 7 Drawing Sheets

METHOD FOR MAINTAINING A SMOOTH SURFACE OF CRYSTALLIZABLE MATERIAL

CROSS-REFERENCE TO RELATED APPLICATIONS

The entire contents of Taiwan Patent Application No. 098131398, filed on Sep. 17, 2009, from which this application claims priority, are incorporated herein by reference.

BACKGROUND OF THE INVENTION

1. Field of the Invention

The present invention generally relates to a method for maintaining a smooth surface of material, and more particularly to a method for maintaining a smooth surface of crystallizable material.

2. Description of Related Art

Generally speaking, in the forming process of crystallizable materials, it is common to form a seed layer which is used as a crystal growth center. Then, a target crystallizable material is further formed based on the seed layer. The materials of the seed layer and the target crystallizable material can be the same or different. FIGS. 1A-1B show crystal-growth steps corresponding to formation of conventional zinc oxide nanorods. First, referring to FIG. 1A, a substrate 110 is provided, and a zinc oxide seed layer 120 is formed on the substrate 110. Then, referring to FIG. 1B, zinc oxide nanorods 150 are formed, wherein the zinc oxide seed layer 120 is used as a crystal growth center.

The dimension of the zinc oxide nanorods 150 is related to the crystallization of the zinc oxide seed layer 120. When the grain size of the zinc oxide seed layer 120 is larger, coarse zinc oxide nanorods 150 can be formed; when the grain size of the zinc oxide seed layer 120 is smaller, smaller zinc oxide nanorods 150 can be formed. In order to adjust the grain size of the zinc oxide seed layer 120, an annealing treatment can be implemented to the zinc oxide seed layer 120 for adjusting the crystallization of the zinc oxide seed layer 120. When the temperature of the annealing treatment is higher, the grain size of the zinc oxide seed layer 120 is bigger; when the temperature of the annealing treatment is lower, the grain size of the zinc oxide seed layer 120 is smaller. By controlling the temperature of the annealing treatment, the dimension of the zinc oxide nanorods 150 can be controlled thereby.

However, when the temperature of the annealing treatment is higher, the grain size of the zinc oxide seed layer 120 is larger, leading to a rough and uneven surface of the zinc oxide seed layer 120. The subsequently formed zinc oxide nanorods 150 will not grow in (e.g., towards) substantially the same direction and will not form an ordered array.

For the disadvantages of the prior art mentioned above, there remains a need to provide a method for maintaining a smooth surface of material. The surface of the material should be maintained smooth after the annealing treatment. High quality nano-structures could then be formed by using the smooth surface of material as a crystal growth center.

SUMMARY OF THE INVENTION

Accordingly, the present invention provides a method for maintaining a smooth surface of material, so as to overcome the drawbacks of the prior art, while further fulfilling requirements of the relevant industry.

One object of the present invention is to provide a method for maintaining a smooth surface of material. The surface of material can be maintained smooth after the annealing treatment.

Another object of the present invention is to provide a method for maintaining a smooth surface of material. A high quality nano-structure can be formed by using the smooth surface of material as a crystal growth center.

According to the objects, the present invention provides a method for maintaining a smooth surface of crystallizable material. First, a substrate is provided. A target material layer is then formed on the substrate, wherein the target material is a crystallizable material. A protecting layer is subsequently formed on the target material layer. Next, an annealing treatment is implemented, wherein the surface of the target material layer, facing the protecting layer, is maintained in its original smooth state by the pressure and/or adhesion of the protecting layer. Finally, the protecting layer is removed to leave an open and smooth surface of the processed crystallizable material.

By the method for maintaining a smooth surface of material of the present invention, the surface of material can be maintained smooth after the annealing treatment. High quality nano-structure can be formed by using the smooth surface of material as a crystal growth center.

DETAILED DESCRIPTION OF THE INVENTION

A detailed description of the present invention will now be provided with reference to the following embodiments, which are not intended to limit the scope of the present invention and which can be adapted for other applications. While the drawings are illustrated in detail, it is appreciated that quantities of components may be greater or less than that disclosed, except for instances expressly restricting amounts of the components.

Figure 1A:
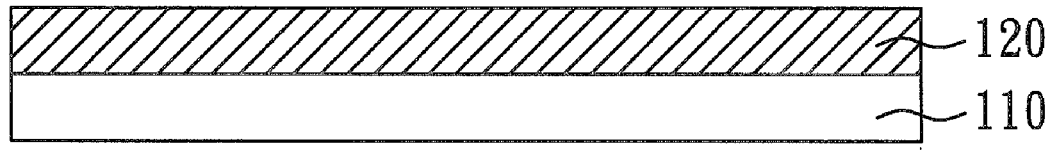
FIGS. 1A-1B show crystal growth steps of conventional zinc oxide nanorods.
Figure 1B:
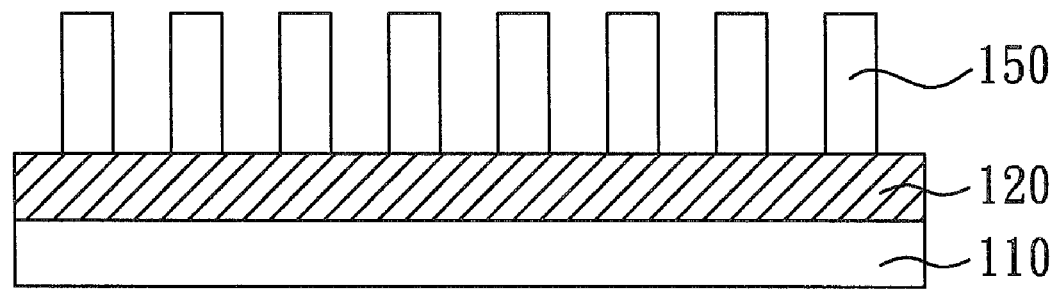
Figure 2:
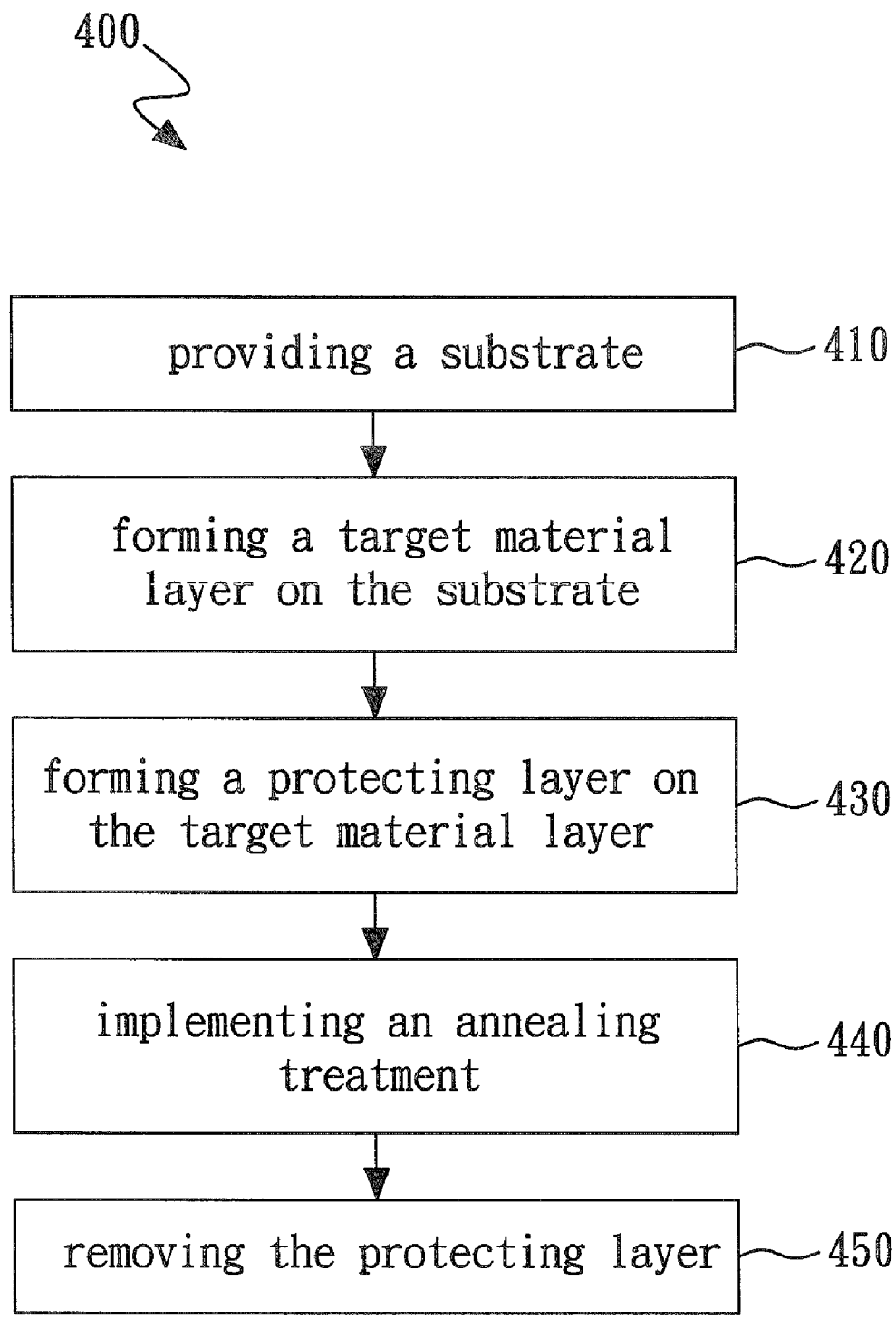
FIG. 2 shows a flow diagram of a method for maintaining a smooth surface of material in accordance with one embodiment of the present invention.

FIG. 2 shows a flow diagram of a method 400 for maintaining a smooth surface of material in accordance with one embodiment of the present invention. The method 400 includes the following steps: step 410, providing a substrate; step 420, forming a target material layer on the substrate, wherein the target material is a crystallizable material; step 430, forming a protecting layer on the target material layer; step 440, implementing an annealing treatment, wherein the surface of the target material layer is maintained in its original smooth state by the pressure and/or adhesion of the protecting layer; and step 450, removing the protecting layer.

Figure 3A:
FIGS. 3A-3E show steps of the method for maintaining a smooth surface of material.

FIGS. 3A-3E show steps of the method 400 for maintaining a smooth surface of material. Referring to FIG. 3A, a substrate 210 is provided. The material of the substrate 210 can be a metal, inorganic material, or plastic material, wherein the inorganic material can include silicon substrate, quartz, glass, or sapphire. Then, a target material layer 220 is formed on the substrate 210. The material of the target material layer 220 is a crystallizable material. The crystallization of the crystallizable material can be adjusted by following an annealing treatment.

The material of the target material layer 220 can be an inorganic semiconductor material or an organic polymer material. The inorganic semiconductor material mentioned above can include at least one or any combination selected from the group consisting of: Zinc oxide (ZnO), tin dioxide ($SnO_2$), indium oxide ($In_2O_3$), indium tin oxide (ITO), aluminum-doped zinc oxide (AZO), cadmium telluride (CdTe), titanium dioxide ($TiO_2$), zinc sulfide (ZnS), zinc selenide (ZnSe), and copper indium gallium selenium compounds ($CuInGaSe_2$). The method for forming the target material layer 220 can be spin coating, dip coating, evaporation, sputtering, atomic layer deposition, electrochemical deposition, pulsed laser deposition, or a metal-organic chemical vapor deposition method.

Figure 3B:
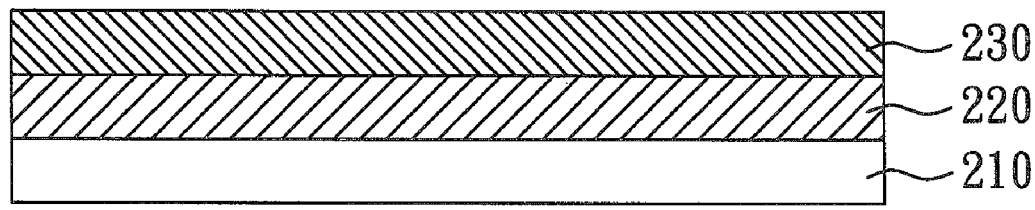

Referring to FIG. 3B, a protecting layer 230 is formed on the target material layer 220. The thickness of the protecting layer 230 is about 10 nm-100 μm. In this embodiment, the protecting layer 230 is formed of a metal material on the target material layer 220 by evaporation. The thickness of the metal material is about tens nm-hundreds nm. In another example, a gold layer, with thickness about 100 nm, is used as the protecting layer. The metal material should have an appropriate strength, high-temperature resistance and high-temperature stability. The metal material can be a single metal material or an alloy material used in conventional evaporation or sputtering processes, such as gold, platinum, chromium, silver, copper, zinc, gold-germanium alloy, gold-beryllium alloy, nickel, titanium, and so on, but is not limited to this. The material of the protecting layer 230 is not limited to a metal material; non-metal materials having appropriate strength, high-temperature resistance, and high-temperature stability can also be used as the material of the protecting layer 230. The method for forming the protecting layer 230 can also be spin coating, dip coating, evaporation, sputtering, atomic layer deposition, electrochemical deposition, pulsed laser deposition, or a metal-organic chemical vapor deposition method.

Figure 3C:
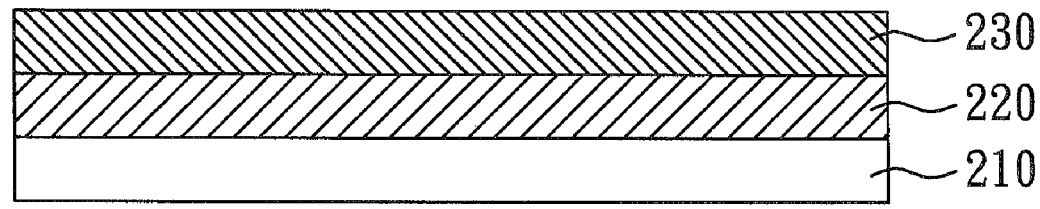

Referring to FIG. 3C, an annealing treatment is implemented. The temperature of the annealing treatment is about 200-2000° C. for increasing the crystallinity of the target material layer 220. When the temperature of the annealing treatment is higher, the grain size of the target material layer 220 is larger; when the temperature of the annealing treatment is lower, the grain size of the target material layer 220 is smaller. The annealing treatment includes at least one or any combination selected from the group consisting of: rapid thermal annealing, high temperature furnace, baking oven, and laser annealing. It is noted that the surface of the target material layer 220 is maintained in its original smooth state by the pressure and/or adhesion of the protecting layer 230 during the annealing treatment.

Figure 3D:
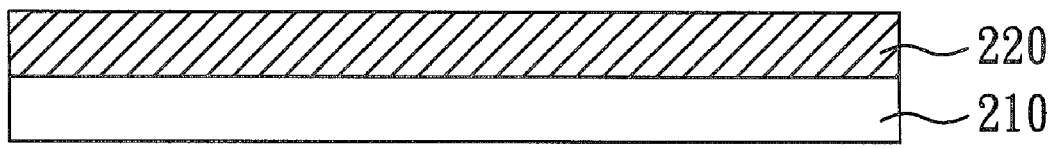

Referring to FIG. 3D, the protecting layer 230 is removed. In this embodiment, the method for removing the protecting layer 230 is a solution method, wherein the protective layer 230 can be dissolved by a solvent, and the solvent does not dissolve or damage the target material layer 220. The solvent is selected according to the material of the protecting layer 230 and the material of the target material layer 220. For example, if the material of the protecting layer 230 is gold, the solvent can be aqua regia, chlorine, bromine solution, potassium iodide, iodine solution, potassium cyanide, or sodium sulfide; if the material of the protecting layer 230 is silver or copper, the solvent can be nitric acid, hot concentrated sulfuric acid, or concentrated hydrochloric acid.

Figure 3E:
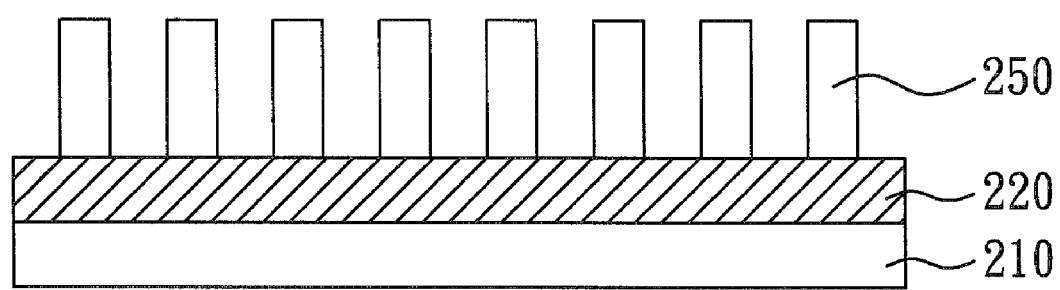

Referring to FIG. 3E, after removing the protecting layer 230, the target material layer 220 can be used as a seed layer for forming an inorganic micro/nano semiconductor structure on the target material layer 220. For example, a micro/nano semiconductor array 250 is formed. The micro/nano semiconductor array 250 can be further used as a crystal growth center for forming a nitride structure. The method for forming the micro/nano semiconductor array 250 mentioned above can be hydrothermal, thermal evaporation, chemical vapor deposition, molecular beam epitaxy, a porous anodic aluminum oxide template method (AAO), or an electrochemical method.

The dimension of the micro/nano semiconductor array 250 is related to the crystallization of the target material layer 220. When the grain size of the target material layer 220 is larger, coarse units of the micro/nano semiconductor array 250 can be formed; when the grain size of the target material layer 220 is smaller, smaller units of the micro/nano semiconductor array 250 can be formed. Therefore, by controlling the temperature of the annealing treatment, the dimension of the units of the micro/nano semiconductor array 250 can be controlled. Moreover, the surface of the target material layer 220 can be maintained smooth after the annealing treatment. The micro/nano semiconductor array 250, formed on the surface of the target material layer 220 as a crystal growth center, will grow in (e.g., towards) substantially the same direction. Thus, high quality micro/nano semiconductor array 250 can be obtained.

According to this embodiment, each unit of the micro/nano semiconductor array 250 is a ZnO nanorod, wherein the length of the ZnO nanorod is about 10 nm to 50 μm, the lateral dimension of the ZnO nanorod is about 30 nm to 10 μm, and the pitch of the ZnO nanorod is about 10 nm to 1000 μm.

Figure 4A:
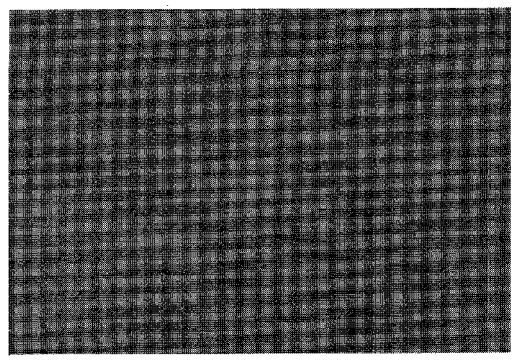
FIGS. 4A-4B show electron microscope images of surfaces of the seed layer of the present invention and the conventional seed layer respectively.
Figure 4B:
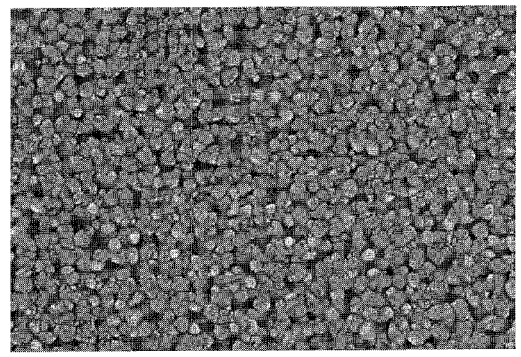

FIGS. 4A-4B show electron microscope images of surfaces of the seed layer of the present invention and the conventional seed layer respectively. As shown in FIG. 4A, the surface of the seed layer of the present invention is maintained smooth after the annealing treatment. On the other hand, as shown in FIG. 4B, the surface of the conventional seed layer is very rough after the annealing treatment.

Figure 5A:
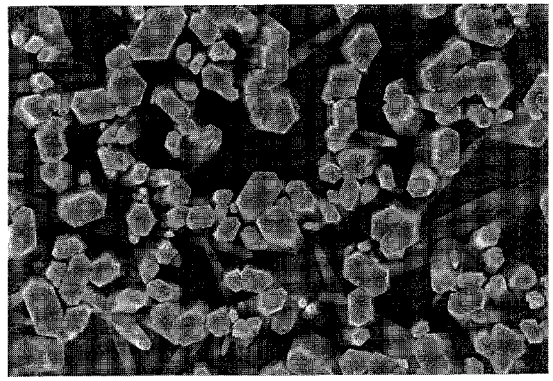
FIGS. 5A-5B show electron microscope images of ZnO nanorods of the present invention and conventional ZnO nanorods respectively.
Figure 5B:
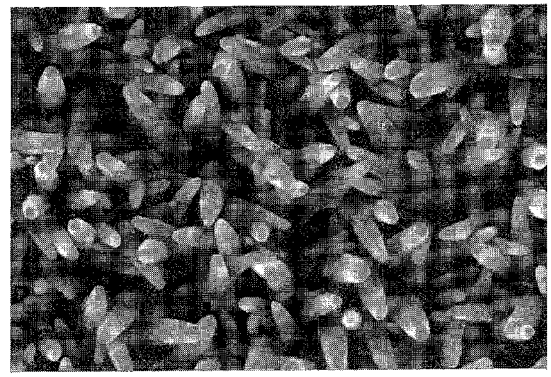

FIGS. 5A-5B show electron microscope images of ZnO nanorods of the present invention and conventional ZnO nanorods respectively. As shown in FIG. 5A, the ZnO nanorods of the present invention are coarse, wherein the ZnO nanorods grow in or towards substantially the same direction. On the other hand, as shown in FIG. 5B, the conventional ZnO nanorods are small, wherein the ZnO nanorods grow in or towards irregular directions.

Figure 6:
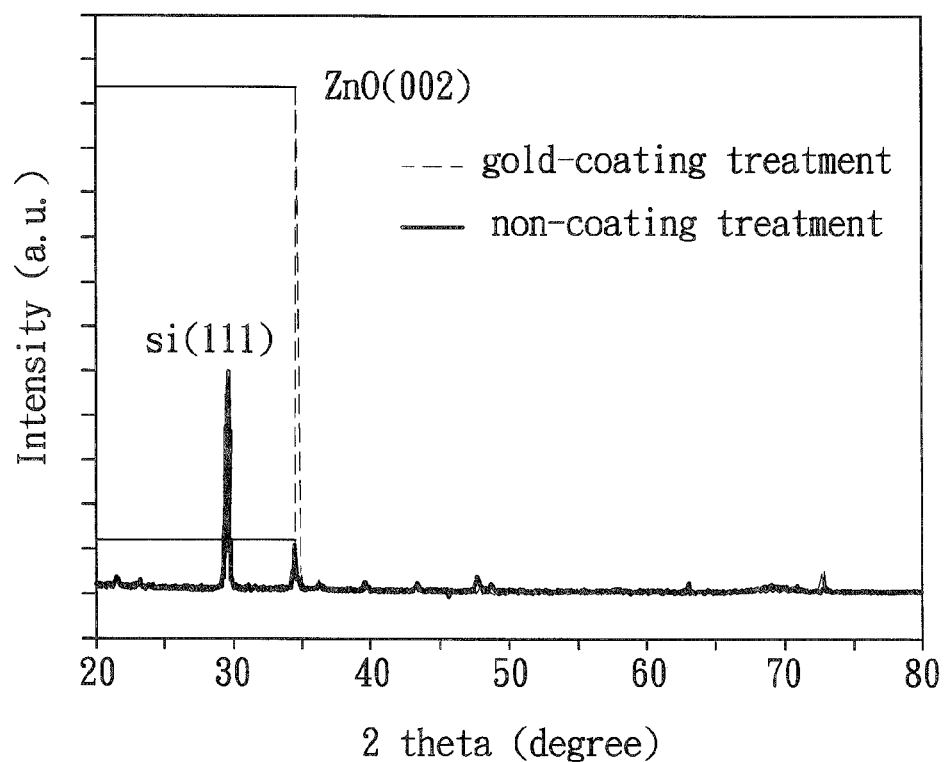
FIG. 6 shows X-ray diffraction patterns of the ZnO nanorods of the present invention and the conventional ZnO nanorods.

FIG. 6 shows X-ray diffraction patterns of the ZnO nanorods of the present invention and the conventional ZnO nanorods. The dashed line represents the ZnO nanorods of the present invention; the solid line represents the conventional ZnO nanorods. According to the peaks which are shown in FIG. 6, a conspicuous peak, which is due to ZnO (002), is observed at a 2θ value of about 34°. The peak intensity of the ZnO nanorods of the present invention is about 11 times that of the peak intensity of the conventional ZnO nanorods. This result indicates that most of the ZnO nanorods of the present invention are (e.g., are oriented) in or towards substantially the same direction.

Figure 7:
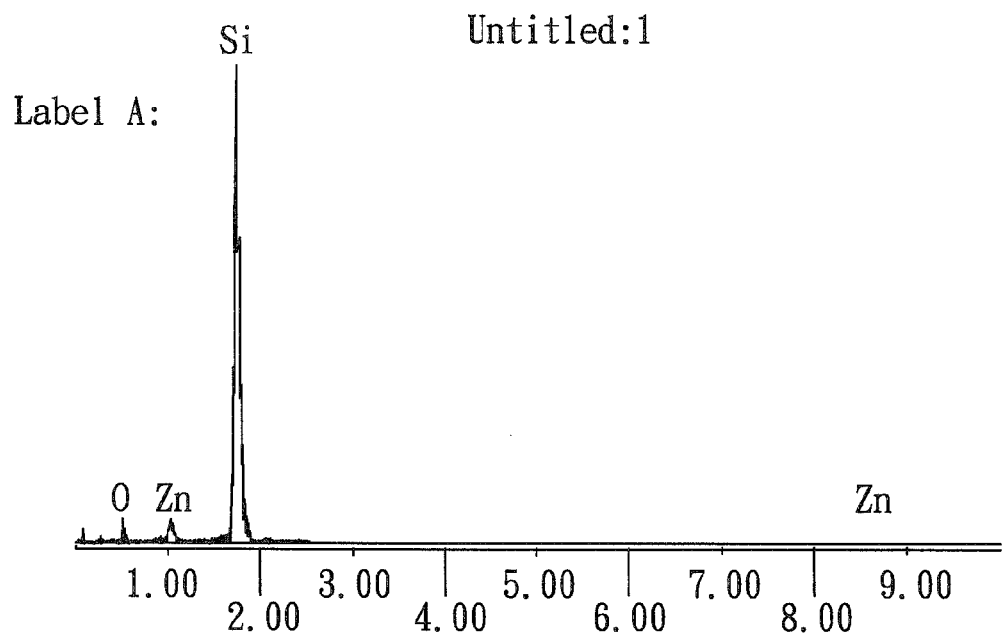
FIG. 7 shows an EDX result of the ZnO seed layer of the present invention.

FIG. 7 shows an EDX result of the ZnO seed layer of the present invention. As shown in FIG. 7, the ingredients of the ZnO seed layer include the substrate (Si) and ZnO seed layer (Zn, O). There is no conspicuous peak showing that the protecting layer (Au) remains on the ZnO seed layer. Thus, one can conclude that the growth of the ZnO nanorods is not related to the protecting layer (Au).

Although specific embodiments have been illustrated and described, it will be appreciated by those skilled in the art that various modifications may be made without departing from the scope of the present invention, which is intended to be limited solely by the appended claims.

What is claimed is:

1. A method for maintaining a smooth surface of material, comprising:
   providing a substrate;
   forming a target material layer on said substrate, wherein said target material is a crystallizable material;
   forming a protecting layer on said target material layer, wherein the material of said protecting layer is metal;
   implementing an annealing treatment, wherein said annealing treatment is used for increasing the crystallinity of said target material layer, the surface of said target material layer is maintained in its original smooth state by the pressure and/or adhesion of said protecting layer; and
   removing said protecting layer.

2. The method for maintaining a smooth surface of material according to claim 1, wherein the temperature of said annealing treatment is about 200-2000° C.

3. The method for maintaining a smooth surface of material according to claim 1, wherein said annealing treatment comprises one or any combination selected from the group consisting of: rapid thermal annealing, high temperature furnace, baking oven, and laser annealing.

4. The method for maintaining a smooth surface of material according to claim 1, wherein the material of said substrate comprises metal, inorganic material, or plastic material.

5. The method for maintaining a smooth surface of material according to claim 1, wherein the material of said substrate is inorganic material, and said inorganic material comprises one selected from the group consisting of: silicon substrate, quartz, glass, and sapphire.

6. The method for maintaining a smooth surface of material according to claim 1, wherein the material of said target material layer comprises an inorganic semiconductor material or an organic polymer material.

7. The method for maintaining a smooth surface of material according to claim 1, wherein the material of said target material layer is an inorganic semiconductor material, and said inorganic semiconductor material comprises one or any combination selected from the group consisting of: Zinc oxide (ZnO), tin dioxide ($SnO_2$), indium oxide ($In_2O_3$), indium tin oxide (ITO), aluminum-doped zinc oxide (AZO), cadmium telluride (CdTe), titanium dioxide ($TiO_2$), zinc sulfide (ZnS), zinc selenide (ZnSe), and copper indium gallium selenium compounds ($CuInGaSe_2$).

8. The method for maintaining a smooth surface of material according to claim 1, wherein the method for forming said target material layer comprises one selected from the group consisting of: spin coating, dip coating, evaporation, sputtering, atomic layer deposition, electrochemical deposition, pulsed laser deposition, and a metal-organic chemical vapor deposition method.

9. The method for maintaining a smooth surface of material according to claim 1, wherein the method for forming said protecting layer comprises one selected from the group consisting of: spin coating, dip coating, evaporation, sputtering, atomic layer deposition, electrochemical deposition, pulsed laser deposition, and a metal-organic chemical vapor deposition method.

10. The method for maintaining a smooth surface of material according to claim 1, wherein said metal comprises one or any combination selected from the group consisting of: gold, platinum, silver, copper, zinc, gold-germanium alloy, gold-beryllium alloy, nickel, and titanium.

11. The method for maintaining a smooth surface of material according to claim 1, wherein the thickness of said protecting layer is about 10 nm-100 μm.

12. The method for maintaining a smooth surface of material according to claim 1, wherein the method for removing said protecting layer is a solution method, said protective layer is dissolved by a solvent, and said target material layer is not dissolved or damaged by said solvent.

13. The method for maintaining a smooth surface of material according to claim 10, further comprising forming an inorganic micro/nano semiconductor structure on said target material layer.

14. The method for maintaining a smooth surface of material according to claim 13, wherein said micro/nano semiconductor structure is a micro/nano semiconductor array.

15. The method for maintaining a smooth surface of material according to claim 14, wherein said target material layer is used as a seed layer.

16. The method for maintaining a smooth surface of material according to claim 14, wherein the method for forming said micro/nano semiconductor array comprises one or more of hydrothermal, thermal evaporation, chemical vapor deposition, molecular beam epitaxy, a porous anodic aluminum oxide template method (AAO), and an electrochemical method.

17. The method for maintaining a smooth surface of material according to claim 14, wherein the length of each unit of said micro/nano semiconductor array is about 10 nm to 50 μm, the lateral dimension of each unit of said micro/nano semiconductor array is about 30 nm to 10 μm, and the pitch of each unit of said micro/nano semiconductor array is about 10 nm to 1000 μm.

18. The method for maintaining a smooth surface of material according to claim 14, further comprising forming a nitride structure, said micro/nano semiconductor array being used as the crystal growth center of said nitride structure.

19. A method for maintaining a smooth surface of material, comprising:
   providing a substrate;
   forming a target material layer on said substrate, wherein said target material is a crystallizable material;
   forming a protecting layer on said target material layer;
   implementing an annealing treatment, wherein the surface of said target material layer is maintained its original smooth state by the pressure and/or adhesion of said protecting layer; and
   removing said protecting layer, wherein the method for removing said protecting layer is a solution method, said protective layer is dissolved by a solvent, the material of said protecting layer is gold, and said solvent comprises at least one selected from the group consisting of: aqua regia, chlorine, bromine solution, potassium iodide, iodine solution, potassium cyanide, or sodium sulfide.

* * * * *